United States Patent
Fan et al.

(10) Patent No.: US 7,692,311 B2
(45) Date of Patent: Apr. 6, 2010

(54) POP (PACKAGE-ON-PACKAGE) DEVICE ENCAPSULATING SOLDERED JOINTS BETWEEN EXTERNAL LEADS

(75) Inventors: Wen-Jeng Fan, Hsinchu (TW); Cheng-Pin Chen, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 344 days.

(21) Appl. No.: 11/984,772

(22) Filed: Nov. 21, 2007

(65) Prior Publication Data

US 2009/0127679 A1    May 21, 2009

(51) Int. Cl.
*H01L 23/12* (2006.01)
(52) U.S. Cl. .................. 257/777; 257/686; 257/666; 257/E25.005; 257/E25.006; 257/E25.021; 257/E25.027; 257/E23.085
(58) Field of Classification Search ................. 257/685, 257/686, 723, 777, E25.005, E25.006, E25.021, 257/E25.027, E23.085, 666–667, E23.031–E23.059; 438/111, 112, 123, FOR. 366, FOR. 367, 438/FOR. 377, FOR. 380
See application file for complete search history.

(56) References Cited

U.S. PATENT DOCUMENTS

| | | | |
|---|---|---|---|
| 6,380,624 B1 * | 4/2002 | Hung | 257/723 |
| 6,462,408 B1 * | 10/2002 | Wehrly, Jr. | 257/686 |
| 7,208,821 B2 * | 4/2007 | Ha et al. | 257/666 |
| 7,375,418 B2 * | 5/2008 | Partridge | 257/685 |
| 7,388,280 B2 * | 6/2008 | Shim et al. | 257/666 |

* cited by examiner

*Primary Examiner*—Jasmine J Clark
(74) *Attorney, Agent, or Firm*—Muncy, Geissler, Olds & Lowe, PLLC

(57) ABSTRACT

A POP (Package-On-Package) semiconductor device with encapsulating protection of soldered joints between the external leads, primarily comprises a plurality of stacked semiconductor packages and dielectric coating. Each semiconductor package includes at least a chip, a plurality of external leads of leadframe, and an encapsulant where the external leads are exposed and extended from a plurality of sides of the encapsulant. Terminals of a plurality external leads of a top semiconductor package are soldered to the soldered regions of the corresponding external leads of a bottom semiconductor package. The dielectric coating is disposed along the sides of the encapsulant of the bottom semiconductor package to connect the soldered points between the external leads and to partially or completely encapsulate the soldering materials so that the stresses between the soldered joints can be dispersed and no electrical shorts happen.

9 Claims, 4 Drawing Sheets

POP (PACKAGE-ON-PACKAGE) DEVICE ENCAPSULATING SOLDERED JOINTS BETWEEN EXTERNAL LEADS

FIELD OF THE INVENTION

The present invention relates to a leadframe-based POP semiconductor device, especially to a leadframe-based POP semiconductor device with encapsulating protection on soldered joints between the external leads.

BACKGROUND OF THE INVENTION

In the recent years, more high-tech electronic devices offer lighter, thinner, and smaller features with friendly operation and multiple functions. In order to meet the requirements of smaller footprints with higher densities, 3D stacking technologies were developed such as POP (Package-On-Package) and DOD (Die-On-Die). One of the POP semiconductor devices is to vertically stack a plurality of leadframe-based semiconductor packages. The leadframe-based POP semiconductor devices using leadframes as chip carriers have the lowest overall cost where the external leads extending from the encapsulants are vertically formed and soldered together to achieve electrical connections. However, the soldered joints between the external leads are vulnerable to break due to CTE mismatch leading to electrical open.

As shown in FIG. 1 and FIG. 2, a conventional leadframe-based POP semiconductor device 100 primarily comprises a first semiconductor package 110 and at least a second semiconductor package 120 stacked above the top of the first semiconductor package 110 where the first semiconductor package 110 and the second semiconductor package 120 are leadframe-based packages for flash memory assembly or DDR memory assembly to increase memory capacities or to add more functions for logic devices, memory devices or other devices. The first semiconductor package 110 comprises a first encapsulant 111, a first chip 112, and a plurality of first external leads 113 (parts of a leadframe) where the first external leads 113 are configured for mounting to a printed circuit board 140 by solder paste 150. The related leadframe packages are TSOP (Thin Small Outline Package), QFP (Quad Flat Package), TQFP (Thin QFP), etc.

The second semiconductor package 120 comprises a second encapsulant 121, a second chip 122 inside the second encapsulant 121, and a plurality of second external leads 123 (parts of another leadframe) where the second external leads 123 of the second semiconductor package 120 are extended and exposed from the second encapsulant 121. Conventionally, the second external leads 123 have exposed portions which are approximately perpendicular to the marking surface of the second encapsulant 121 and are soldered to the soldered regions of the first external leads 113 of the first semiconductor package 110 by soldering materials 130 such as solder paste. Since the soldered joints, where the soldering materials 130 are disposed, between the first external leads 113 and the second external leads 123 are individually formed, therefore, the soldered joints will easily break during TCT (Temperature Cycling Test). After FA (Failure Analysis), the breaks of the soldered joints between the first external leads 113 and the second external leads 123 are due to mismatch of CTE (Coefficient of Temperature Expansion) inside the first semiconductor packages 110 and the second semiconductor package 120. For example, the CTE of the first encapsulant 111 of the first semiconductor package 110 and the second encapsulant 121 of the second semiconductor package 120 are 10 ppm/° C. when below Tg (Glass transition temperature) and 36 ppm/° C. when above Tg where the normal Tg of EMC encapsulant is around 120° C. However, the materials of normal leadframes such as the first external leads 113 and the second external leads 123 are metal or alloy such as Alloy 42 where the CTE is around 4.3 ppm/° C. There is an order difference between the CTE of the leadframe such as Alloy 42 and the one of the first encapsulant 111 and the second encapsulant 121. When the temperature of the conventional leadframed-based POP semiconductor device 100 becomes higher due to operation, the volume expansion of the first encapsulant 111 and the second encapsulant 121 will be much larger than the corresponding ones of the leadframes, i.e., the first external leads 113 and the second external leads 123 where the expansion differences due to higher temperatures will induce stresses at the second external leads 123 from contacts of the first encapsulant 111 and the second external leads 121, as shown in FIG. 1. Therefore, the soldered joints of the second external leads 123 will experience concentrated stresses, especially the second external leads 123 located at the edges of the second semiconductor package 120 leading to soldering breaks.

SUMMARY OF THE INVENTION

The main purpose of the present invention is to provide a POP semiconductor device with encapsulating protection of soldered joints between the external leads to disperse the stresses exerted on the soldered joints of the external leads, to avoid the breaks of the soldering joints due to CTE mis-match of different package materials, and to avoid electrical open.

The second purpose of the present invention is to provide a POP semiconductor device with encapsulating protection of soldered joints between the external leads to absorb the stresses exerted on the soldered joints of the external leads due to CTE mis-match between the different package materials.

The third purpose of the present invention is to provide a POP semiconductor device with encapsulating protection of soldered joints between the external leads to encapsulate the soldering materials at the soldered joints of the external leads to enhance heat dissipation and to maintain good electrical connections between the external leads under high temperatures.

According to the present invention, a POP semiconductor device primarily comprises a first semiconductor package, at least a second semiconductor package, soldering materials, and dielectric coating. The first semiconductor package comprises a first encapsulant, at least a first chip encapsulated inside the first encapsulant, and a plurality of first external leads of leadframe where the first external leads are extended and exposed from the sides of the first encapsulant. The second semiconductor package is stacked above the first semiconductor package where the second semiconductor package includes a second encapsulant, at least a second chip encapsulated inside the second encapsulant, and a plurality of second external leads of leadframe where the second external leads are extended and exposed from the sides of the second encapsulant. The exposed terminals of the second external leads are soldered to the soldered regions of the corresponding first external leads by the soldering materials. The dielectric coating is disposed along the sides of the first encapsulant of the first semiconductor package to connect the terminals of the second external leads with the soldered regions of the corresponding first external leads and to encapsulate the soldering materials. Accordingly, the stresses exerted on the soldered joints between the external leads can be dispersed to the first external leads and electrical shorts will be avoided.

DETAIL DESCRIPTION OF THE INVENTION

Please refer to the attached drawings, the present invention will be described by means of embodiment(s) below.

Figure 1:
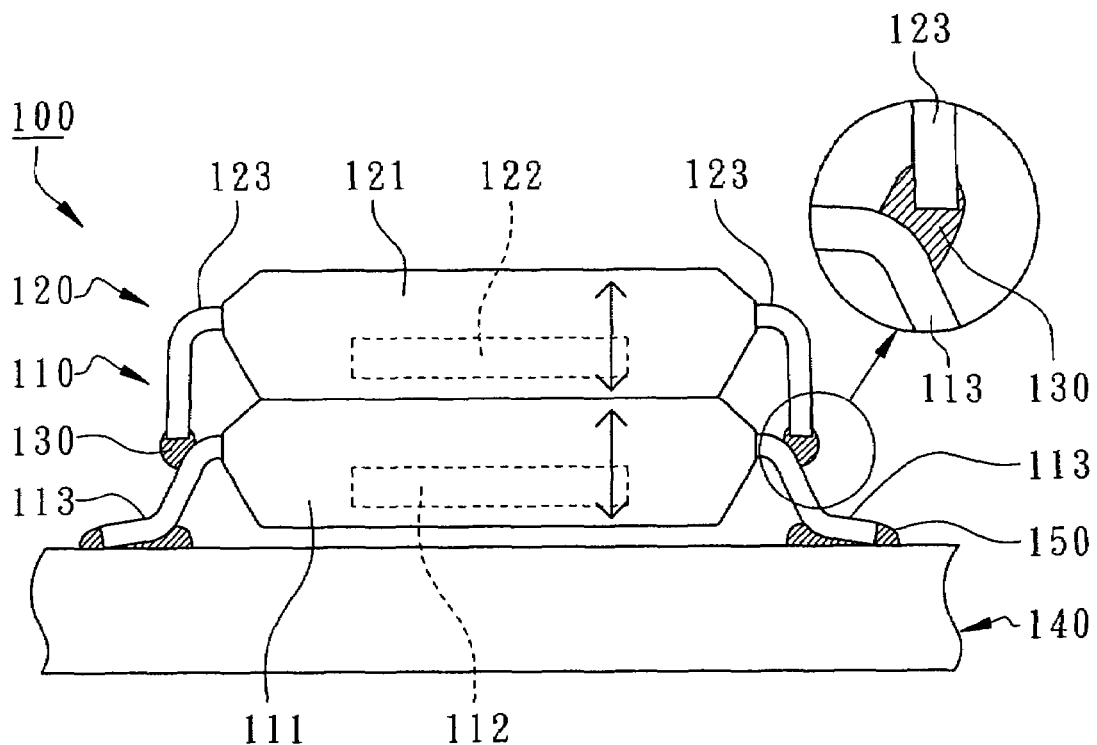
FIG. 1 shows a front view of a conventional leadframed-based POP semiconductor device.
Figure 2:
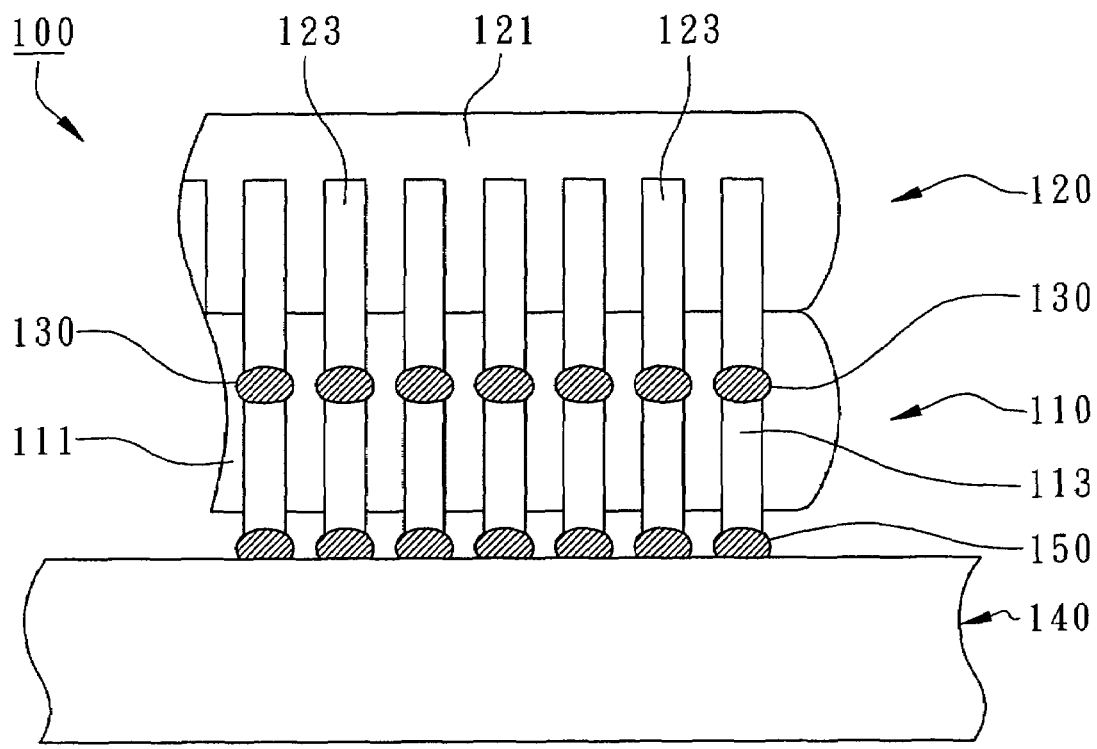
FIG. 2 shows a partial side view of a conventional lead-framed-based POP semiconductor device.
Figure 3:
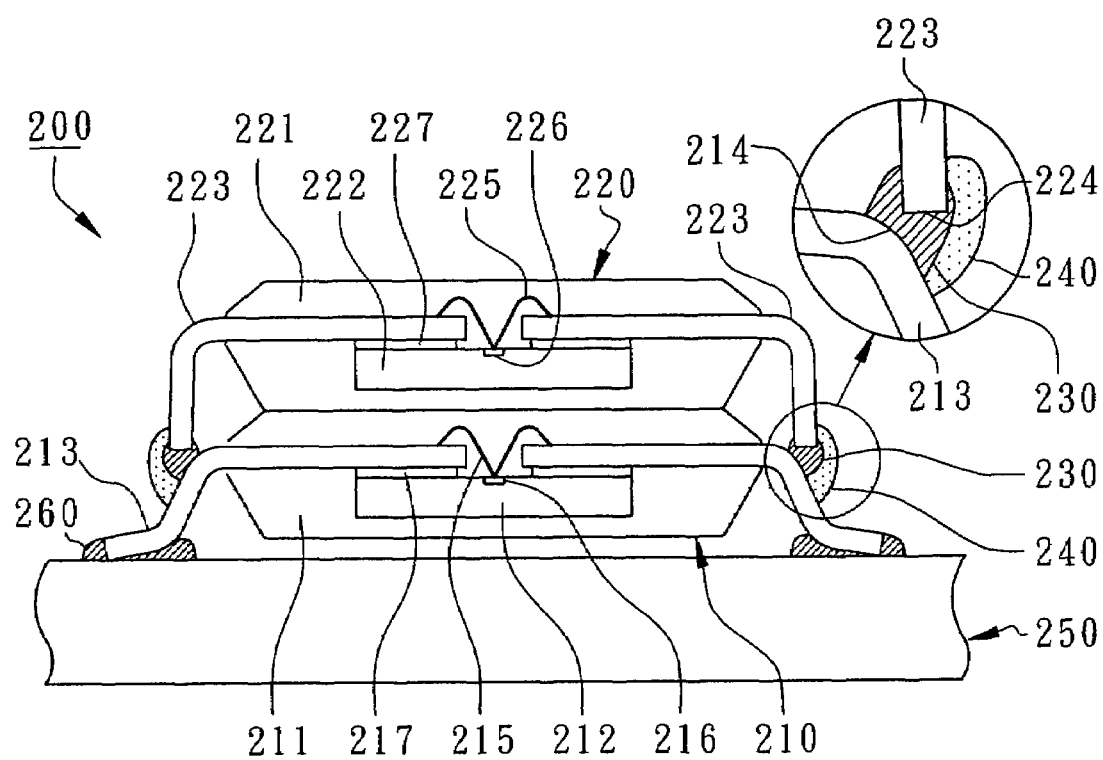
FIG. 3 shows a cross-sectional view of a POP semiconductor device according to the first embodiment of the present invention.
Figure 4:
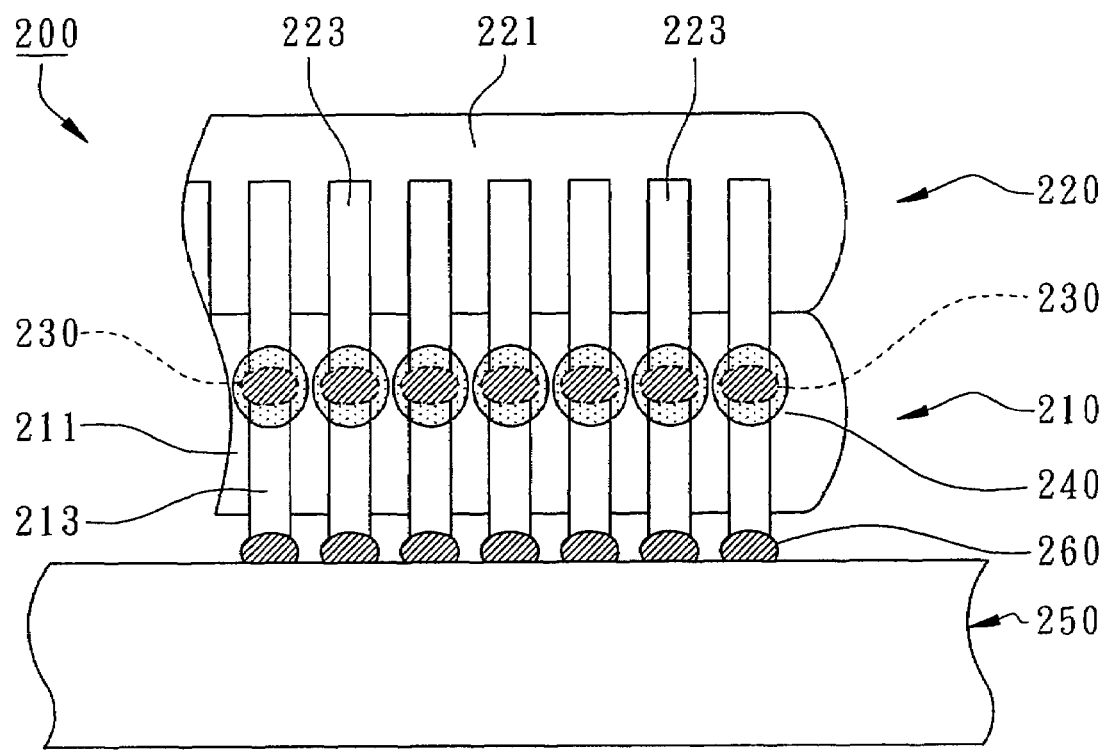
FIG. 4 shows a partial side view of the POP semiconductor device according to the first embodiment of the present invention.

FIG. 3 and FIG. 4 are related to the first embodiment of the present invention, a POP semiconductor device 200 is provided with encapsulating protection of soldered joints between the external leads, which primarily comprises a first semiconductor package 210, at least a second semiconductor package 220, soldering materials 230, and dielectric coating 240. Therein, the first semiconductor package 210 and the second semiconductor package 220 can be single-chip package or multi-chip package. As shown in FIG. 3, in the present embodiment, the first semiconductor package 210 and the second semiconductor package 220 are single-chip TSOP's (Thin Small Outline Package). The first semiconductor package 210 includes a first encapsulant 211, a first chip 212 encapsulated inside the first encapsulant 211, and a plurality of first external leads 213 of leadframe. The first chip 212 has a plurality of first bonding pads 216 disposed on its active surface. In this embodiment, the active surface of the first chip 212 is attached to the bottom surfaces of the inner leads connected with the first external leads 213 inside the encapsulant 211 by the die-attaching material 217. The first bonding pads 216 are electrically connected to the top surfaces of the inner leads by a plurality of the first bonding wires 215. The first encapsulant 211 formed during encapsulation encapsulates the first chip 212, the first bonding wires 215, and the inner leads connected with the first external leads 213. The first external leads 213 are extended and exposed from the sides of the first encapsulant 211. In the present embodiment, the first external leads 213 are gull leads for surface mounting to a printed circuit board 250 by solder paste 260 connecting the terminals of the first external leads 213 where the printed circuit board 250 can be mother boards, memory module boards, carriers for display cards, substrates for memory cards, or communication boards for cellular phones, etc.

The second semiconductor package 220 is stacked above the first semiconductor package 210 to manufacture a tiny leadframe-based POP semiconductor device with multiple stacked TSOP's. The second semiconductor package 220 includes a second encapsulant 221, at least a second chip 222 encapsulated by the second encapsulant 221, and a plurality of second external leads 223 of leadframe where the second external leads 223 are extended and exposed from the second encapsulant 221. Preferably, the second external leads 223 are approximately vertical so that the terminals 224 of the second external leads 223 can be soldered to the soldered regions 214 of the first external leads 213 by the soldering materials 230, as shown in the enlarged figure in FIG. 3. As shown in FIG. 3, in the present embodiment, the second semiconductor package 220 further comprises at least a die-attaching material 227 and a plurality of second bonding wires 225. The second chip 222 is attached to the inner leads connected with the second external leads 223 of the leadframe or on a die pad of leadframe, not shown in the figures. The second chip 222 has a plurality of second bonding pads 226 electrically connected to the corresponding second external leads 223 by a plurality of the second bonding wires 225. Except the extended external leads from the sides, the semiconductor package 220 can be the same or not the same as the first semiconductor package 210.

Normally, the first chip 212 and the second chip 222 can be memory chips such as flash, DRAM, etc., to increase the memory capacity without increasing package footprints. Alternatively, the first chip 212 and the second chip 222 can be logic products etc.

Normally, as shown in FIGS. 3 and 4, the first encapsulant 211 and the second encapsulant 221 are epoxy molding compound, EMC. Moreover, the bottom surface of the second encapsulant 221 can contact with the top surface of the first encapsulant 211 to reduce the overall stacking height. Preferably, the dielectric coating 240 is far from the second encapsulant 221 as shown in FIG. 4 so that the dielectric coating 240 can absorb the stresses from soldering points between the external leads 213 and 223.

Furthermore, as shown in FIG. 3, the terminals 224 of the second external leads 223 are electrically connected to the soldered regions 214 of the first external leads 213 by the soldering materials 230 where the soldering materials 230 may be meltable conductive metal such as tin-lead solder or lead-free solder paste.

As shown in FIG. 3 and FIG. 4, the dielectric coating 240 is disposed and mechanically connects the terminals 224 of the second external leads 223 with the soldered regions 214 of the first external leads 213. The connected portions of the terminals 224 by the dielectric coating 240 include the singulation-cut ends of the second external leads 223, sides of the second external leads 223 adjacent the singulation-cut ends, or the both. In the present embodiment, as shown in FIG. 4 again, the dielectric coating 240 includes a plurality of dots to encapsulate the soldering materials 230 respectively and to connect the second external leads 223 to the corresponding first external leads 213 so that the stresses exerted on the soldered joints at the locations of the soldering materials 230 can be absorbed by the dielectric coating 240 and some stresses can be transferred to the first external leads 213 to avoid breaks of the soldered joints. Therein, the stresses are caused by CTE mismatch of the package materials. Preferably, as shown in FIG. 3 again, the dielectric coating 240 is formed in a specific pattern and in a forming sequence after POP stacking so that the mentioned-above connected terminals of the first external leads 260 have exposed inner surfaces. As a result, the terminals of the first external leads 260 can be bonded to the PCB 250 by solder paste 260 and the POP semiconductor device 200 is reworkable.

Figure 5:
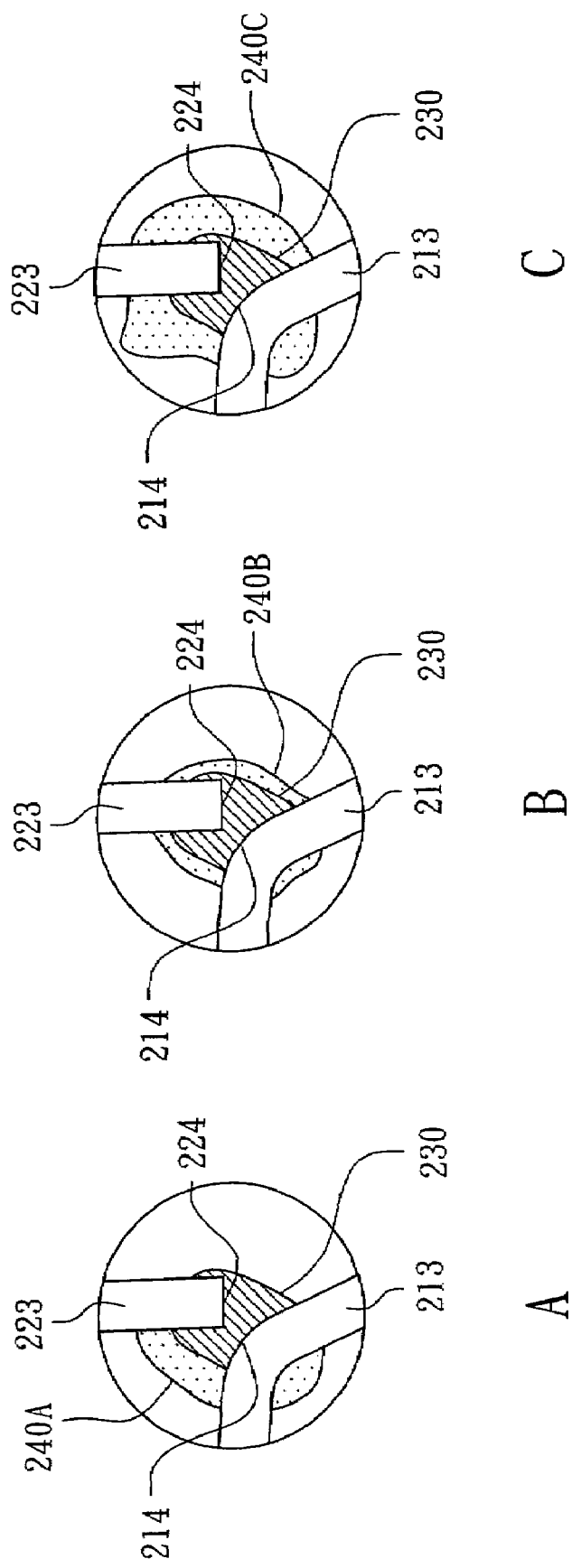
FIG. 5 shows partially enlarged cross-sectional views at soldering points of the POP semiconductor device to illustrate various encapsulating forms of dielectric coatings according to the first embodiment of the present invention.

In the present embodiment, the dielectric coating 240 can partially encapsulate the outer surface of the soldering materials 230 facing the external leads as shown in FIG. 3. However, the viscosity and the coating amounts can be adjusted for different encapsulating areas and encapsulating shapes. In a different embodiment, a dielectric coating 240A can partially encapsulate the inner surface of the soldering materials 230 facing the encapsulants, as shown in FIG. 5A. Alternatively, another dielectric coating 240B can completely encapsulate the soldering materials 230 with thinner coating thickness, as shown in FIG. 5B. Another dielectric coating 240C can completely encapsulate the soldering materials 230 with thicker coating thickness, as shown in FIG. 5C.

Preferably, the dielectric coating 240 is low modulus to absorb the stresses between the first external leads 213 and the second external leads 223 to enhance the capability of the POP semiconductor device 200 to resist external impacts, dropping, thermal cycles, and thermal shocks. Therefore, the breaks of soldered joints between the external leads will not easily happen at the POP semiconductor device 200 to enhance product reliability. To be more specific, the dielectric coating 240 can be thermal-conductive silicone with thermal conductivities equal to or larger than the ones of the first encapsulant 211 and the second encapsulant 221 to enhance heat dissipation.

Figure 6:
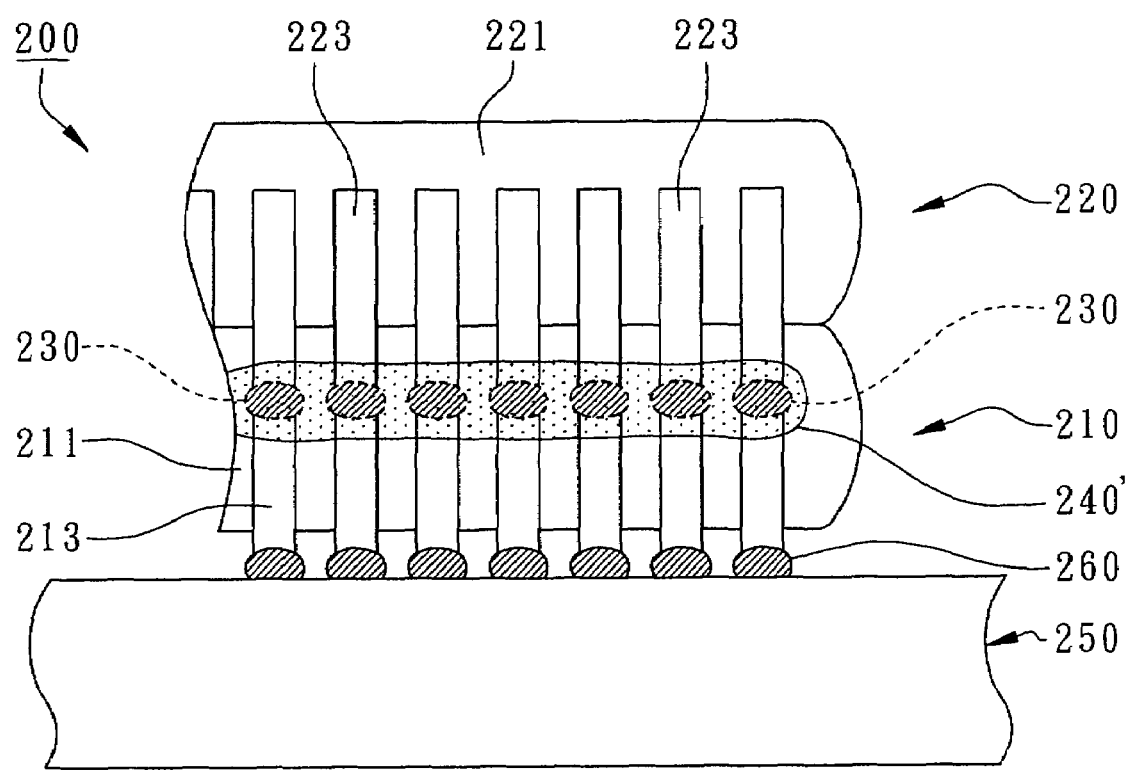
FIG. 6 shows a partial side view of another POP semiconductor device according to another embodiment of the present invention.

As shown in FIG. 6, a POP semiconductor device 200 possesses encapsulating protection of soldered joints between the external leads, which primarily comprises a first semiconductor package 210, at least a second semiconductor package 220, soldering materials 230, and dielectric coating 240'. The major components are the same as the embodiment described above except the shape of the dielectric coating 240', therefore, the figure numbers will be the same. The first semiconductor package 210 includes a first encapsulant 211 encapsulating at least a chip and a plurality of first external leads 213 of leadframe. Terminals of the first external leads 213 are soldered to a printed circuit board 250 by solder paste 260. The second semiconductor package 220 is stacked above the first semiconductor package 210, where the second semiconductor package 220 includes a second encapsulant 221 encapsulating at least a chip and a plurality of second external leads 223 of leadframe. The terminals of the second external leads 223 are soldered to the soldered regions of the first external leads 213 by the solder paste 230. The dielectric coating 240' is disposed along the sides of the first encapsulant 211 of the first semiconductor package 210 and connects the terminals 224 of the second external leads 223 with the corresponding first external leads 213 and encapsulates the soldering materials 230 to disperse the stresses between the soldered joints between external leads and to avoid electrical shorts. Preferably, the dielectric coating 240' is formed in a strip mechanically connecting the terminals of the second external leads 223 together to disperse stresses between different second external leads 223.

The above description of embodiments of this invention is intended to be illustrative and not limiting. Other embodiments of this invention will be obvious to those skilled in the art in view of the above disclosure.

What is claimed is:

1. A POP (Package-On-Package) semiconductor device comprising:
    a first semiconductor package including a first encapsulant, at least a first chip encapsulated inside the first encapsulant, and a plurality of first external leads of leadframe, wherein the first external leads are exposed and extended from a plurality of sides of the first encapsulant;
    at least a second semiconductor package stacked above the first semiconductor package, the second semiconductor package including a second encapsulant, at least a second chip encapsulated inside the second encapsulant, and a plurality of second external leads of leadframe, wherein the second external leads are exposed and extended from a plurality of sides of the second encapsulant;
    soldering materials soldering a plurality of terminals of the second external leads to a plurality of soldered regions of the corresponding first external leads; and
    dielectric coating disposed to cover the soldering materials.

2. The device as claimed in claim 1, wherein the dielectric coating is low modulus to absorb the stresses between the first external leads and the second external leads.

3. The device as claimed in claim 2, wherein the dielectric coating is a thermal-conductive silicone.

4. The device as claimed in claim 1, wherein the second encapsulant is in contact with the first encapsulant but the dielectric coating is far from the second encapsulant.

5. The device as claimed in claim 1, wherein the dielectric coating partially encapsulates the soldering materials.

6. The device as claimed in claim 1, wherein the dielectric coating completely encapsulates the soldering materials.

7. The device as claimed in claim 1, wherein the dielectric coating includes a plurality of dots.

8. The device as claimed in claim 1, wherein the dielectric coating is a strip connecting the terminals of the second external leads together.

9. The device as claimed in claim 1, wherein the dielectric coating is formed in a specific pattern so that a plurality of terminals of the first external leads are exposed.

* * * * *